(12) United States Patent
Fan

(10) Patent No.: US 11,128,296 B2
(45) Date of Patent: Sep. 21, 2021

(54) METHOD AND DEVICE FOR SIMULATION OF CMOS RADIO FREQUENCY SWITCH AND COMMUNICATION TERMINAL

(71) Applicant: Shanghai Huahong Grace Semiconductor Manufacturing Corporation, Shanghai (CN)

(72) Inventor: Xiangquan Fan, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 0 days.

(21) Appl. No.: 16/853,488

(22) Filed: Apr. 20, 2020

(65) Prior Publication Data
US 2021/0175886 A1 Jun. 10, 2021

(30) Foreign Application Priority Data
Dec. 4, 2019 (CN) .......................... 201911263033.4

(51) Int. Cl.
*H03K 17/693* (2006.01)
*H03K 17/0412* (2006.01)
*H03K 17/687* (2006.01)
*G06F 30/20* (2020.01)

(52) U.S. Cl.
CPC .......... *H03K 17/693* (2013.01); *G06F 30/20* (2020.01); *H03K 17/04123* (2013.01); *H03K 2017/6878* (2013.01)

(58) Field of Classification Search
CPC .......... H03K 17/04123; H03K 17/693; H03K 2017/6878
See application file for complete search history.

(56) References Cited

U.S. PATENT DOCUMENTS 10,135,438 B2* 11/2018 Heaney .................. H01L 21/84
2011/0301932 A1* 12/2011 Yoshitomi ............. G06F 30/367
703/14

* cited by examiner

*Primary Examiner* — Lincoln D Donovan
*Assistant Examiner* — Colleen J O Toole
(74) *Attorney, Agent, or Firm* — Harness, Dickey & Pierce, P.L.C.

(57) ABSTRACT

The present disclosure provides a method and a device for simulation of a CMOS radio frequency switch and a communication terminal. The method includes: receiving a first value; obtaining a current value of a first function based on the first value, when the CMOS radio frequency switch is in an on-state, the value of the first function is a first function value, and when the CMOS radio frequency switch is in an off-state, the value of the first function is a second function value; receiving a second value; receiving a third value; outputting an off-state capacitance value of the CMOS radio frequency switch based on the second value and the third value; and outputting an on-state resistance value of the CMOS radio frequency switch based on the second value, the third value and the current value of the first function.

10 Claims, 7 Drawing Sheets

METHOD AND DEVICE FOR SIMULATION OF CMOS RADIO FREQUENCY SWITCH AND COMMUNICATION TERMINAL

CROSS-REFERENCE TO RELATED APPLICATIONS

This application claims the benefit of priority to Chinese patent application No. 201911263033.4, filed on Dec. 4, 2019. The entire contents of this application are hereby incorporated herein by reference.

TECHNICAL FIELD

The present disclosure relates to the field of CMOS radio frequency switch design, and more particularly to a method and a device for simulation of a CMOS radio frequency switch, and a communication terminal.

BACKGROUND

Radio frequency switch is a key component in modern wireless communication systems, and is mainly applied to switch receiving and transmitting channels and select multiple channels.

Complementary metal oxide semiconductor (CMOS) radio frequency switch based on a silicon-on-insulator (SOI) process is widely used in modern wireless communication systems, which adopts NMOS transistors in a common CMOS process, due to the achievement of a balance between system integration and cost.

At present, before the CMOS radio frequency switch based on the SOI process is specifically implemented, it is usually necessary to simulate the CMOS radio frequency switch to obtain relevant parameter values, and to use the obtained parameter values for subsequent simulation to further understand radio frequency performance of the CMOS radio frequency switch. Based on simulation results of the radio frequency performance, it can be determined whether arrangements of the NMOS transistors in the CMOS radio frequency switch need to be adjusted.

Existing methods for simulation can accurately obtain relatively comprehensive parameters of the CMOS radio frequency switch, however, simulation speed is slow, which results in a long design cycle of the CMOS radio frequency switch.

SUMMARY

Embodiments of the present disclosure provide a method and a device for simulation of a CMOS radio frequency switch to improve the simulation speed of the CMOS radio frequency switch based on the SOI process.

An embodiment of the present disclosure provides a method for simulation of a CMOS radio frequency switch, the CMOS radio frequency switch includes one branch or more than one branch coupled in parallel, and each branch includes at least one NMOS transistor. The method includes: receiving a first value indicating a gate voltage value applied by the CMOS radio frequency switch; obtaining a current value of a first function based on the first value, wherein the first function is a function which takes the gate voltage value applied by the CMOS radio frequency switch as an independent variable, when the CMOS radio frequency switch is in an on-state, the value of the first function is a first function value, and when the CMOS radio frequency switch is in an off-state, the value of the first function is a second function value, wherein the first function value is less than the second function value; receiving a second value indicating a number of the branch in the CMOS radio frequency switch; receiving a third value indicating a number of the at least one NMOS transistor coupled in series on each branch of the CMOS radio frequency switch; outputting an off-state capacitance value of the CMOS radio frequency switch based on the second value and the third value; and outputting an on-state resistance value of the CMOS radio frequency switch based on the second value, the third value and the current value of the first function.

In some embodiment, the first function is:

$$F(VG)=2/(PVG1+1+\tanh(VG/PVG2));$$

wherein F(VG) indicates the first function, VG indicates the gate voltage valve applied by the CMOS radio frequency switch, PVG1 indicates a first model parameter value, and PVG1∈(0 , 0.01], PVG2 is a second model parameter value, and PVG2 belongs to (0, 1], and tanh(VG/PVG2) is a hyperbolic tangent function of the gate voltage value VG applied by the CMOS radio frequency switch.

In some embodiment, the first model parameter value PVG1 and the second model parameter value PVG2 are obtained through practical tests.

In some embodiment, outputting an off-state capacitance value of the CMOS radio frequency switch based on the second value and the third value includes: obtaining the off-state capacitance value C(XC1) of the CMOS radio frequency switch by following formula:

$$C(XC1)=CDS1*W/NS;$$

wherein XC1 indicates an equivalent capacitance of the CMOS radio frequency switch in the off-state, CDS1 indicates an off-state capacitance of source-drain of each transistor per unit width, W indicates a product of a width value of each transistor and the second value, and NS indicates the third value.

In some embodiment, outputting an on-state resistance value of the CMOS radio frequency switch based on the second value, the third value and the current value of the first function includes: obtaining the on-state resistance value R(XR1) of the CMOS radio frequency switch by following formula:

$$R(XR1)=RDS1*NS/W*F(VG);$$

wherein XR1 indicates an equivalent resistance of the CMOS radio frequency switch in the on-state, RDS1 indicates an on-state resistance of source-drain of each transistor per unit width, W indicates a product of a width value of each transistor and the second value, NS indicates the third value, and F(VG) indicates the first function value taking the gate voltage value VG applied by the CMOS radio frequency switch as the independent variable.

Another embodiment of the present disclosure provides a device for simulation of a CMOS radio frequency switch, the CMOS radio frequency switch includes one branch or more than one branch coupled in parallel, and each branch includes at least one NMOS transistor. The device includes: a first receiving unit configured to receive a first value indicating a gate voltage value applied by the CMOS radio frequency switch; a calculating unit configured to obtain a current value of a first function based on the first value, wherein the first function is a function which takes the gate voltage value applied by the CMOS radio frequency switch as an independent variable, when the CMOS radio frequency switch is in an on-state, the value of the first function is a first function value, and when the CMOS radio frequency switch is in an off-state, the value of the first function is a second function value, wherein the first function value is less than the second function value; a second receiving unit configured to receive a second value indicating a number of the branch in the CMOS radio frequency switch; a third receiving unit configured to receive a third value indicating a number of the at least one NMOS transistor coupled in series on each branch of the CMOS radio frequency switch; a first outputting unit configured to output an off-state capacitance value of the CMOS radio frequency switch based on the second value and the third value; and a second outputting unit configured to output an on-state resistance value of the CMOS radio frequency switch based on the second value, the third value and the current value of the first function.

In some embodiment, the calculating unit takes following function as the first function:

$$F(VG)=2/(PVG1+1+\tanh(VG/PVG2));$$

wherein F(VG) indicates the first function, VG indicates the gate voltage valve applied by the CMOS radio frequency switch, PVG1 indicates a first model parameter value, and PVG1∈(0 , 0.01], PVG2 is a second model parameter value, and PVG2 belongs to (0, 1], and tanh(VG/PVG2) is a hyperbolic tangent function of the gate voltage value VG applied by the CMOS radio frequency switch.

In some embodiment, the first model parameter value PVG1 and the second model parameter value PVG2 are obtained through practical tests.

In some embodiment, the first outputting unit obtains the off-state capacitance value C(XC1) of the CMOS radio frequency switch by following formula:

$$C(XC1)=CDS1*W/NS;$$

wherein XC1 indicates an equivalent capacitance of the CMOS radio frequency switch in the off-state, CDS1 indicates an off-state capacitance of source-drain of each transistor per unit width, W indicates a product of a width value of each transistor and the second value, and NS indicates the third value.

In some embodiment, the second outputting unit obtains the on-state resistance value R(XR1) of the CMOS radio frequency switch by following formula:

$$R(XR1)=RDS1*NS/W*F(VG);$$

wherein XR1 indicates an equivalent resistance of the CMOS radio frequency switch in the on-state, RDS1 indicates an on-state resistance of source-drain of each transistor per unit width, W indicates a product of a width value of each transistor and the second value, NS indicates the third value, and F(VG) indicates the first function value taking the gate voltage value VG applied by the CMOS radio frequency switch as the independent variable.

Another embodiment of the present disclosure provides a computer-readable storage medium having stored thereon computer instructions, wherein the computer instructions can be executed by a processor to perform steps of the foregoing method for simulation.

Another embodiment of the present disclosure provides a communication terminal including a memory stored with computer instructions and a processor, wherein when the computer instructions are executed by the processor, the processor can perform steps of the foregoing method for simulation.

Compared with the prior art, the embodiments of the present disclosure have the following beneficial effects.

With above solutions, since only the off-state capacitance value and the on-state resistance value of the CMOS radio frequency switch are output, the simulation speed of the CMOS radio frequency switch can be greatly improved compared with other solutions in which other parameter values are also output. In addition, when subsequent simulations are performed using the relevant parameters of the CMOS radio frequency switch, the simulation results can also be accurately obtained.

DETAILED DESCRIPTION

At present, in order to simulate the CMOS radio frequency switch, it is necessary to connect an equivalent circuit of each CMOS transistor in the CMOS radio frequency switch according to arrangements of CMOS transistors in the CMOS radio frequency switch, so as to achieve the CMOS radio frequency switch composed of equivalent circuits of multiple CMOS transistors. By simulating the equivalent circuits of the CMOS radio frequency switch, comprehensive parameters can be obtained, but the simulation speed is very slow.

It has been found by the present inventor that the off-state capacitance value and on-state resistance value play an important role in all parameters of the CMOS radio frequency switch when the simulation results of the CMOS radio frequency switch are used for subsequent simulation or other processing.

Based on this, the present disclosure provides a simulation method for a CMOS radio frequency switch. Only the off-state capacitance value and the on-state resistance value of the CMOS radio frequency switch are output, thus the simulation speed of the CMOS radio frequency switch can be greatly improved compared with other solutions in which other parameter values are also output. When subsequent simulations are performed using the relevant parameters of the CMOS radio frequency switch, the simulation results can also be accurately obtained.

In order to make above objects, features and beneficial effects of the present disclosure more obvious and understandable, specific embodiments of the present disclosure will be described in detail in combination with the attached drawings.

Embodiments of the present disclosure provide a simulation method for a CMOS radio frequency switch. In some embodiments of the present disclosure, the CMOS radio frequency switch includes one branch or more than one branch coupled in parallel, and each branch includes at least one NMOS transistor.

In order to facilitate the understanding and implementation of the present disclosure, the CMOS radio frequency switch will be briefly described below.

Figure 1:
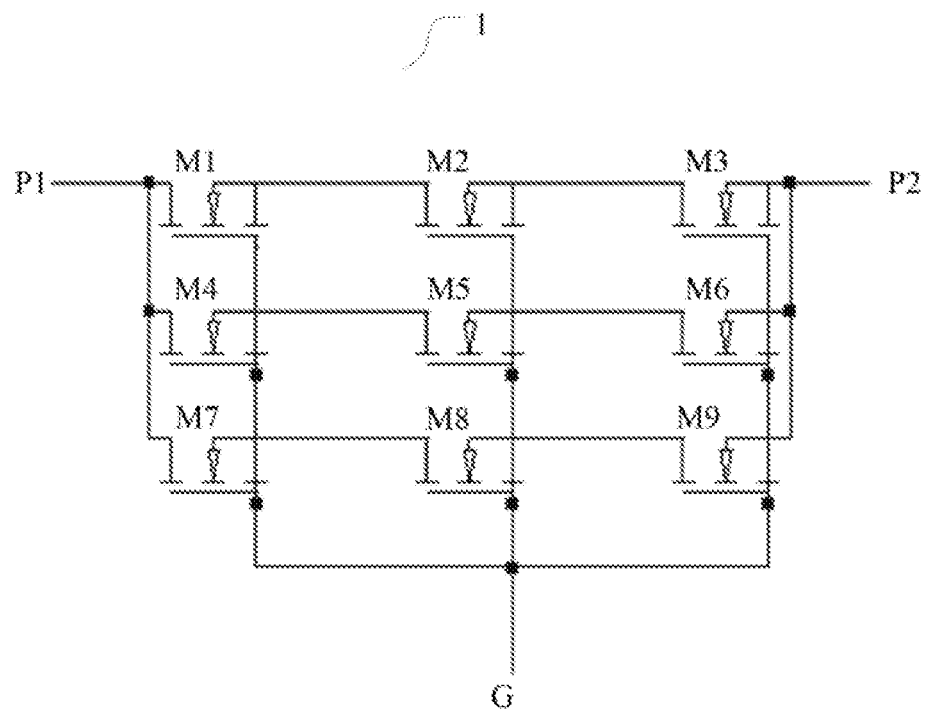
FIG. 1 shows a schematic diagram of a circuit structure of a CMOS radio frequency switch.

FIG. 1 shows a schematic diagram of a circuit structure of a CMOS radio frequency switch. Referring to FIG. 1, the CMOS radio frequency switch 1 includes nine NMOS transistors, from M1 to M9 respectively. Wherein, M1-M3 are coupled in series to form a first branch, M4-M6 are coupled in series to form a second branch, and M7-M9 are coupled in series to form a third branch. Gate terminals of all NMOS transistors are coupled with a gate voltage output terminal G P1 is one output terminal of the CMOS radio frequency switch and P2 is the other input terminal of the CMOS radio frequency switch.

When all NMOS transistors are switched on, the CMOS radio frequency switch is in an off-state. When all NMOS transistors are switched off, the CMOS radio frequency switch is in an on-state.

It can be understood that in specific embodiments, the CMOS radio frequency switch can also adopt other circuit structures, but each branch includes at least one NMOS transistor, and at least one branch is provided.

It has been found by the present inventor that main parameters affecting the performance of the CMOS radio frequency switch are the off-state capacitance value and the on-state resistance value. An optimum value of the CMOS radio frequency switch is FOM=C(XC1)*R(XR1). Wherein, C(XC1) indicates the off-state capacitance value of the CMOS radio frequency switch, and R(XR1) indicates the on-state resistance value of the CMOS radio frequency switch.

Figure 2:
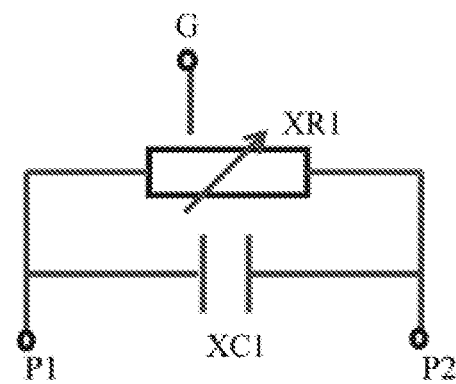
FIG. 2 shows a schematic diagram of an equivalent circuit structure of a CMOS radio frequency switch.

Therefore, in some embodiments of the present disclosure, the equivalent circuit of the CMOS radio frequency switch 1 is shown in FIG. 2.

It can be understood that the CMOS radio frequency switch having other circuit structures can essentially be equivalent to the circuit structure shown in FIG. 2.

Based on the above CMOS radio frequency switch, the method for simulation of the CMOS radio frequency switch is described in detail as follows.

Figure 3:
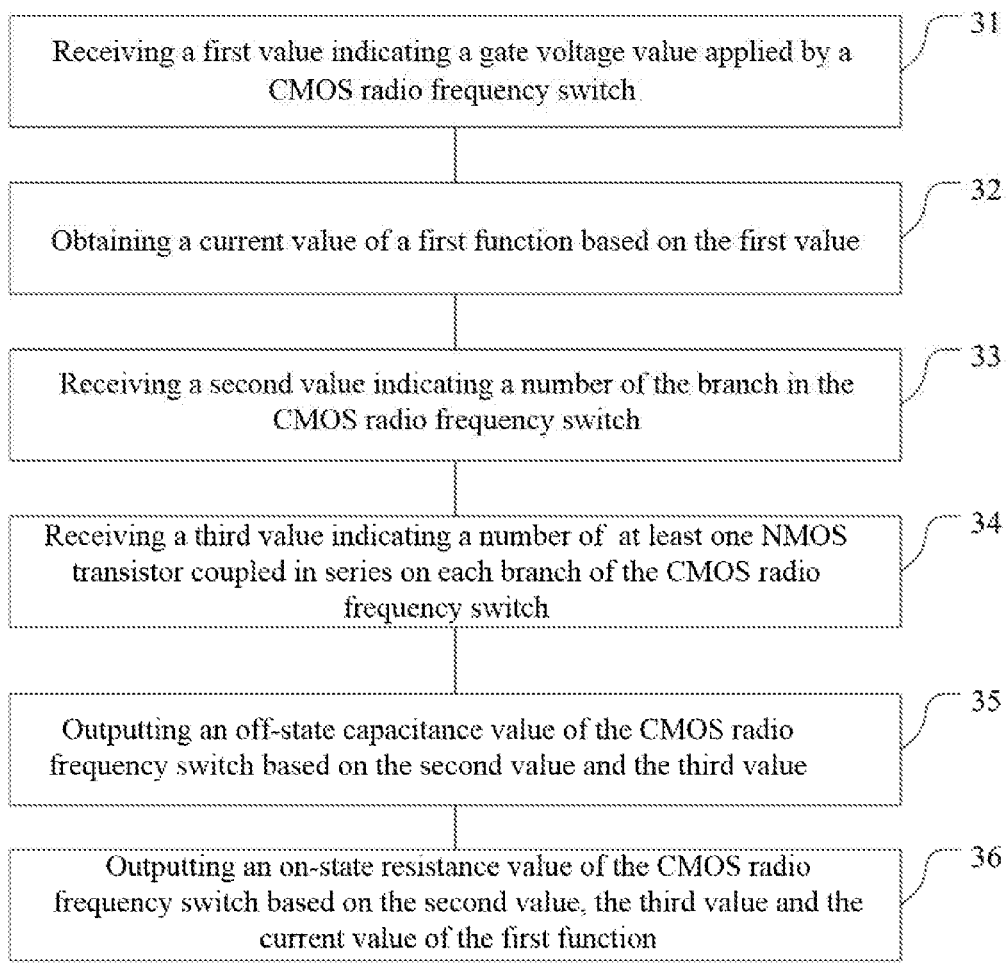
FIG. 3 shows a flowchart of a simulation method for a CMOS radio frequency switch according to an embodiment of the present disclosure.

Referring to FIG. 3, the method may include following steps:

S31, receiving a first value indicating a gate voltage value applied by the CMOS radio frequency switch.

In the CMOS radio frequency switch, the gates of all NMOS transistors are coupled with the gate voltage output terminal and are inputted with a same gate voltage value VG S32, obtaining a current value of a first function based on the first value.

The first function is a function which takes the gate voltage value applied by the CMOS radio frequency switch as an independent variable. When the CMOS radio frequency switch is in an on-state, the value of the first function is a first function value, and when the CMOS radio frequency switch is in an off-state, the value of the first function is a second function value. The first function value is less than the second function value.

Figure 4:
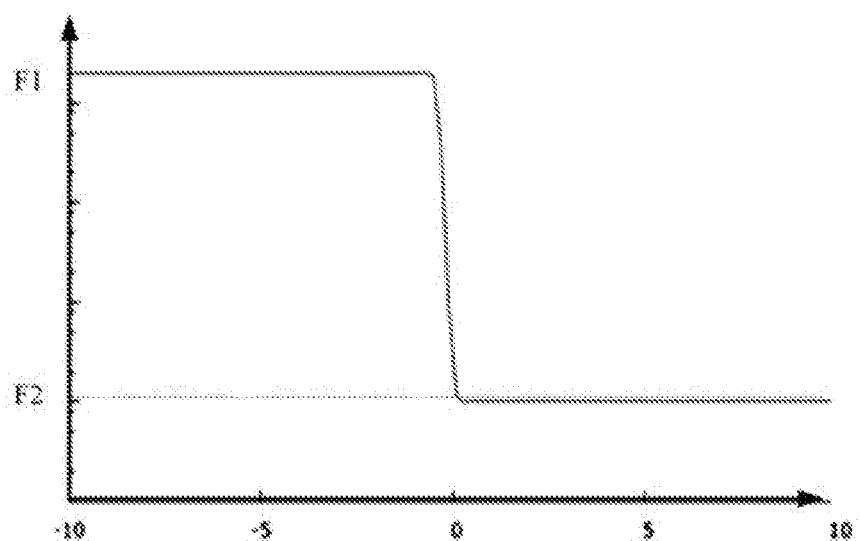
FIG. 4 shows a schematic diagram of a curve of a first function according to an embodiment of the present disclosure.

As shown in FIG. 4, a horizontal axis represents the gate voltage value VG and a vertical axis represents the value of the first function F(VG). Curve 41 shows a change curve of the first function F(VG) with the gate voltage value VG Referring to FIG. 4, when the CMOS radio frequency switch is in the on-state, the value of the first function F (VG) is the first function value F1, and when the CMOS radio frequency switch is in the off-state, the value of the first function F(VG) is the second function value F2, and the first function value F1 is less than the second function value F2.

The value of the first function F(VG) is larger when the CMOS radio frequency switch is in the on-state, while the value of the first function F(VG) is smaller when the CMOS radio frequency switch is in the off-state, which is consistent with the change of the CMOS radio frequency switch, thus the current value of the first function can be used to obtain the on-state resistance of the CMOS radio frequency switch subsequently.

In one embodiment of the present disclosure, the first function is:

$$F(VG)=2/(PVG1+1+\tanh(VG/PVG2)); \qquad (1)$$

wherein, F(VG) indicates the first function, VG indicates the gate voltage value applied by the CMOS radio frequency switch, PVG1 indicates a first model parameter value, and PVG1∈(0, 0.01], PVG2 is a second model parameter value, and PVG2 belongs to (0, 1], and tanh(VG/PVG2) is a hyperbolic tangent function of the gate voltage value VG applied by the CMOS radio frequency switch.

In some embodiments, the first model parameter value PVG1 and the second model parameter value PVG2 can be obtained through practical tests. Specifically, a plurality of CMOS radio frequency switches achieved by circuits can be tested to obtain the changing relationship between the F(VG) and VG so as to determine the first model parameter value PVG1 and the second model parameter value PVG2.

It can be understood that in specific embodiments, the first function can also have other expressions, as long as it can have a stable larger value when the CMOS radio frequency switch is in the on-state, and have a stable smaller value when the CMOS radio frequency switch is in the off-state.

S33, receiving a second value indicating a number of the branch in the CMOS radio frequency switch.

In some embodiments, the CMOS radio frequency switch may include only one branch, and may also include two or more branches.

S34, receiving a third value indicating a number of the at least one NMOS transistor coupled in series on each branch of the CMOS radio frequency switch.

In some embodiments, the number of the NMOS transistors coupled in series on each branch in the CMOS radio frequency switch may be only one, or may be two or more.

S35, outputting the off-state capacitance value of the CMOS radio frequency switch based on the second value and the third value.

In some embodiments, the off-state capacitance value C(XC1) of the CMOS radio frequency switch may be obtained by following formula:

$$C(XC1)=CDS1*W/NS; \qquad (2)$$

wherein, XC1 indicates an equivalent capacitance of the CMOS radio frequency switch in the off-state, CDS1 indicates an off-state capacitance of a source-drain of each transistor per unit width, W indicates a product of a width value of each transistor and the second value, and NS indicates the third value.

In some embodiments, CDS1 can be obtained according to actual tests, that is, the off-state capacitance of the source-drain of the transistor per unit width is obtained through actual tests.

S36, outputting the on-state resistance value of the CMOS radio frequency switch based on the second value, the third value and the current value of the first function.

In some embodiments, the on-state resistance value R(XR1) of the CMOS radio frequency switch may be obtained by following formula:

$$R(XR1)=RDS1*NS/W*F(VG); \quad (3)$$

wherein, XR1 indicates an equivalent resistance of the CMOS radio frequency switch in the on-state, RDS1 indicates an on-state resistance of source-drain of each transistor per unit width, W indicates a product of a width value of each transistor and the second value, NS indicates the third value, and F(VG) indicates the first function value taking the gate voltage value VG applied by the CMOS radio frequency switch as the independent variable.

In some embodiments, S31, S33 and S34 can be performed simultaneously or sequentially, and specific performing sequence is not limited. S35 and S36 may be performed simultaneously or sequentially, and specific performing sequence is not limited.

Figure 5A:
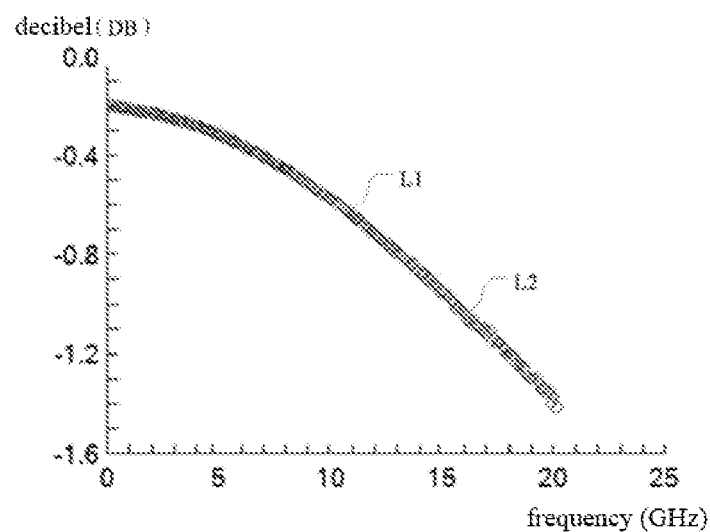
FIGS. 5a-5c show a comparison diagram of actual test data and simulation results of parameter S21 of a CMOS radio frequency switch in an on-state according to an embodiment of the present disclosure.
Figure 5B:
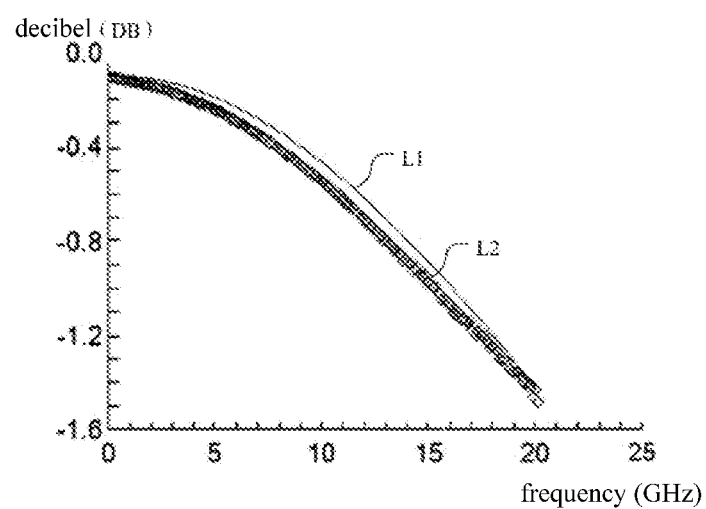
Figure 5C:
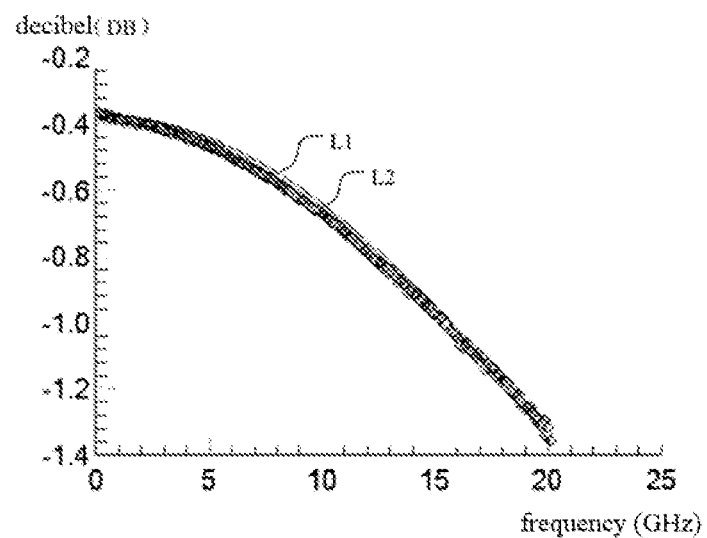
Figure 6A:
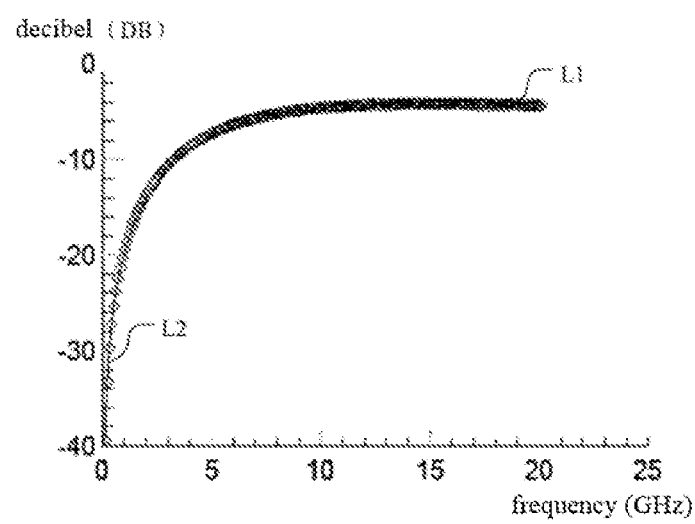
FIGS. 6a-6c show a comparison diagram of actual test data and simulation results of parameter S21 of a CMOS radio frequency switch in an off-state according to an embodiment of the present disclosure.
Figure 6B:
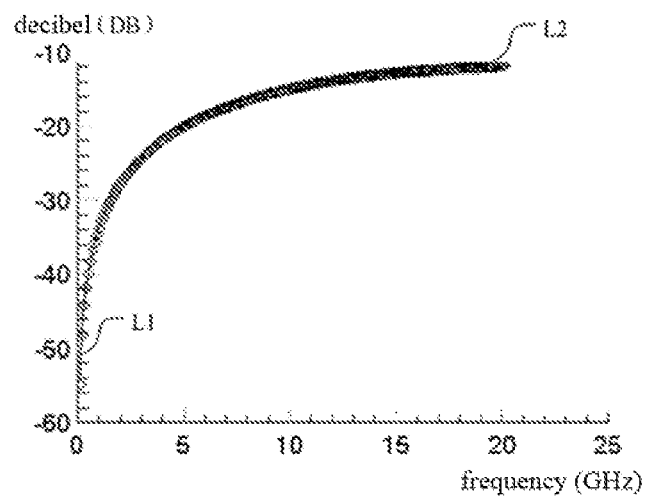
Figure 6C:
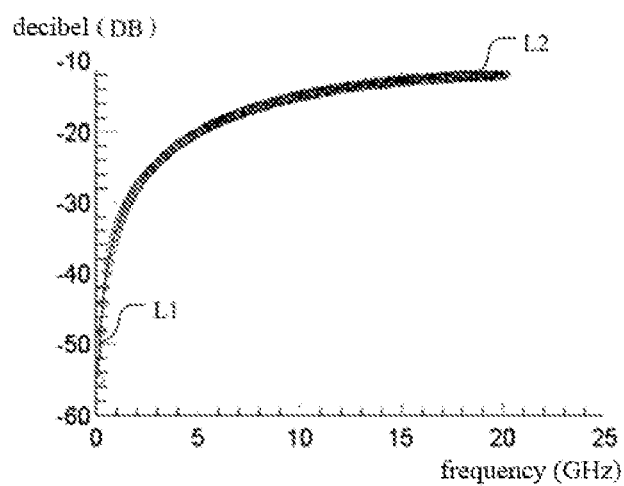

With the method for simulation of the CMOS radio frequency switch according to the embodiments of the present disclosure, after obtaining the off-state capacitance value and the on-state resistance value, the radio frequency scattering parameter (parameter S) of the CMOS radio frequency switch is simulated. FIGS. 5a-5c show a comparison diagram of actual test data and simulation results of parameter S21 (i.e., insertion loss) of the CMOS radio frequency switch in the on-state. FIGS. 6a-6c show a comparison diagram of actual test data and simulation results of parameter S21 (i.e., isolation) of the CMOS radio frequency switch in the off-state.

FIG. 5a and FIG. 6a show comparison diagrams of the actual test data and simulation results of parameter S21 of the CMOS radio frequency switch in the on-state and the off-state when W=1.0 mm and NS=4. FIG. 5b and FIG. 6b show comparison diagrams of the actual test data and simulation results of parameter S21 of the CMOS radio frequency switch in the on-state and the off-state when W=2.5 mm and NS=4. FIG. 5c and FIG. 6c show comparison diagrams of the actual test data and simulation results of the parameter S21 of the CMOS radio frequency switch in the on-state when W=2.5 mm and NS=8.

As shown in FIGS. 5a-5c, except for FIG. 5b, the actual test data (i.e., curve L1) and the simulation results (i.e., curve L2) of the parameter S21 of the CMOS radio frequency switch in the on-state basically coincide. As shown in FIGS. 6a-6c, the actual test data and the simulation results of the parameter S21 of the CMOS radio frequency switch in the off-state basically coincide.

It can be seen from FIGS. 5a-5c and FIGS. 6a-6c that, with the relevant parameters obtained by applying the simulation method for the CMOS radio frequency switch according to the embodiments of the present disclosure, the simulation results can also be accurately obtained in the subsequent simulation.

From above, it can be seen that the simulation method for the CMOS radio frequency switch according to the embodiments of the present disclosure can not only improve the simulation speed of the CMOS radio frequency switch, but also accurately obtain the simulation results when using the off-state capacitance value and the on-resistance value for subsequent simulation.

In order to enable the person skilled in the art to better understand and implement the present disclosure, a device for simulation corresponding to the foregoing method for simulation of the CMOS radio frequency switch is described in detail hereinafter.

Figure 7:
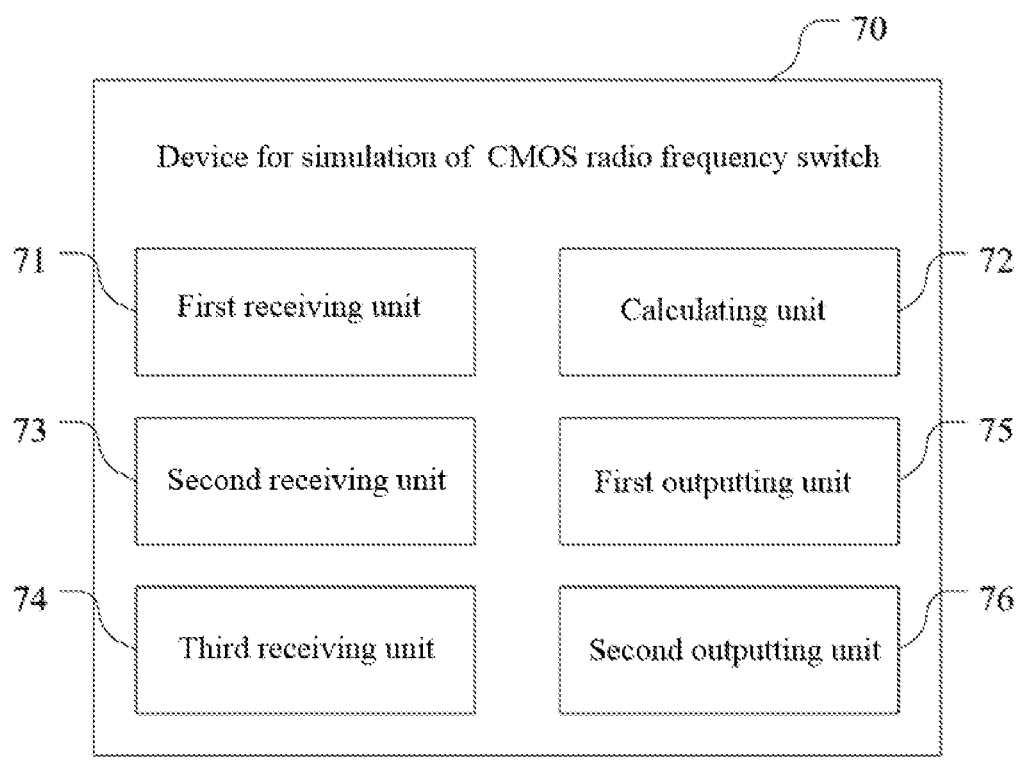
FIG. 7 shows a schematic structural diagram of a simulation device for a CMOS radio frequency switch according to an embodiment of the present disclosure.

Referring to FIG. 7, an embodiment of the present disclosure further provides a device 70 for simulation of the CMOS radio frequency switch. The CMOS radio frequency switch includes one branch or more than one branch coupled in parallel, and each branch includes at least one NMOS transistor. The simulation device 70 for the CMOS radio frequency switch may include a first receiving unit 71, a calculating unit 72, a second receiving unit 73, a third receiving unit 74, a first outputting unit 75, and a second outputting unit 76.

The first receiving unit 71 is configured to receive a first value, and the first value indicates a gate voltage value applied by the CMOS radio frequency switch.

The calculating unit 72 is configured to obtain a current value of a first function based on the first value, and the first function is a function which takes the gate voltage value applied by the CMOS radio frequency switch as an independent variable. When the CMOS radio frequency switch is in an on-state, the value of the first function is a first function value, and when the CMOS radio frequency switch is in an off-state, the value of the first function is a second function value. The first function value is less than the second function value.

The second receiving unit 73 is configured to receive a second value, and the second value indicates a number of the branch in the CMOS radio frequency switch.

The third receiving unit 74 is configured to receive a third value, and the third value indicates a number of the at least one NMOS transistor coupled in series on each branch of the CMOS radio frequency switch.

The first outputting unit 75 is configured to output an off-state capacitance value of the CMOS radio frequency switch based on the second value and the third value.

The second outputting unit 76 is configured to output an on-state resistance value of the CMOS radio frequency switch based on the second value, the third value and the current value of the first function.

In some embodiments of the present disclosure, the calculating unit 72 takes following function as the first function:

$$F(VG)=2/(PVG1+1+\tanh(VG/PVG2));$$

wherein, F(VG) indicates the first function, VG indicates the gate voltage valve applied by the CMOS radio frequency switch, PVG1 indicates a first model parameter value, and PVG1∈(0, 0.01], PVG2 is a second model parameter value, and PVG2 belongs to (0, 1], and tanh(VG/PVG2) is a hyperbolic tangent function of the gate voltage value VG applied by the CMOS radio frequency switch.

In some embodiments of the present disclosure, the first model parameter value PVG1 and the second model parameter value PVG2 are obtained through practical tests.

In some embodiments of the present disclosure, the first outputting unit 75 obtains the off-state capacitance value C(XC1) of the CMOS radio frequency switch by following formula:

$$C(XC1)=CDS1*W/NS;$$

wherein, XC1 indicates an equivalent capacitance of the CMOS radio frequency switch in the off-state, CDS1 indicates an off-state capacitance of source-drain of each transistor per unit width, W indicates a product of a width value of each transistor and the second value, and NS indicates the third value.

In some embodiments of the present disclosure, the second outputting unit 76 obtains the on-state resistance value R(XR1) of the CMOS radio frequency switch by following formula:

$$R(XR1)=RDS1*NS/W*F(VG);$$

wherein, XR1 indicates an equivalent resistance of the CMOS radio frequency switch in the on-state, RDS1 indicates an on-state resistance of source-drain of each transistor per unit width, W indicates a product of a width value of each transistor and the second value, NS indicates the third value, and F(VG) indicates the first function value taking the gate voltage value VG applied by the CMOS radio frequency switch as the independent variable.

The simulation device 70 may be provided with a keyboard, a display, and the like, so as to facilitate input of the first value, the second value, and the third value. Certainly, the simulation device 70 can also support remote input to provide convenience for users.

Another embodiment of the present disclosure provides a computer-readable storage medium having stored thereon computer instructions, wherein the computer instructions can be executed by a processor to perform steps of the foregoing method for simulation. The storage medium may include a ROM, a RAM, a magnetic disk, or an optical disk.

Another embodiment of the present disclosure provides a communication terminal including a memory stored with computer instructions and a processor. When the computer instructions are executed by the processor, the processor can perform steps of the foregoing method for simulation.

Although the present disclosure has been disclosed above, the present disclosure is not limited thereto. Any changes and modifications may be made by those skilled in the art without departing from the spirit and scope of the present disclosure, and the scope of the present disclosure should be determined by the appended claims.

The invention claimed is:

1. A method for simulation of a CMOS radio frequency switch, the CMOS radio frequency switch comprising one branch or more than one branch coupled in parallel, and each branch comprising at least one NMOS transistor, the method comprising:
receiving a first value indicating a gate voltage value applied by the CMOS radio frequency switch;
obtaining a current value of a first function based on the first value, wherein the first function is a function which takes the gate voltage value applied by the CMOS radio frequency switch as an independent variable, when the CMOS radio frequency switch is in an on-state, the value of the first function is a first function value, and when the CMOS radio frequency switch is in an off-state, the value of the first function is a second function value, wherein the first function value is less than the second function value;
receiving a second value indicating a number of the branch in the CMOS radio frequency switch;
receiving a third value indicating a number of the at least one NMOS transistor coupled in series on each branch of the CMOS radio frequency switch;
outputting an off-state capacitance value of the CMOS radio frequency switch based on the second value and the third value; and
outputting an on-state resistance value of the CMOS radio frequency switch based on the second value, the third value and the current value of the first function,
wherein the first function is:

$$F(VG)=2/(PVG1+1+\tanh(VG/PVG2));$$

wherein F(VG) indicates the first function, VG indicates the gate voltage valve applied by the CMOS radio frequency switch, PVG1 indicates a first model parameter value, and PVG1∈(0, 0.01], PVG2 is a second model parameter value, and PVG2 belongs to (0, 1], and tanh(VG/PVG2) is a hyperbolic tangent function of the gate voltage value VG applied by the CMOS radio frequency switch.

2. The method according to claim 1, wherein the first model parameter value PVG1 and the second model parameter value PVG2 are obtained through practical tests.

3. The method according to claim 1, wherein outputting an off-state capacitance value of the CMOS radio frequency switch based on the second value and the third value comprises:
obtaining the off-state capacitance value C(XC1) of the CMOS radio frequency switch by following formula:

$$C(XC1)=CDS1*W/NS;$$

wherein XC1 indicates an equivalent capacitance of the CMOS radio frequency switch in the off-state, CDS1 indicates an off-state capacitance of source-drain of each transistor per unit width, W indicates a product of a width value of each transistor and the second value, and NS indicates the third value.

4. The simulation method according to claim 1, wherein outputting an on-state resistance value of the CMOS radio frequency switch based on the second value, the third value and the current value of the first function comprises:
obtaining the on-state resistance value R(XR1) of the CMOS radio frequency switch by following formula:

$$R(XR1)=RDS1*NS/W*F(VG);$$

wherein XR1 indicates an equivalent resistance of the CMOS radio frequency switch in the on-state, RDS1 indicates an on-state resistance of source-drain of each transistor per unit width, W indicates a product of a width value of each transistor and the second value, NS indicates the third value, and F(VG) indicates the first function value taking the gate voltage value VG applied by the CMOS radio frequency switch as the independent variable.

5. A device for simulation of a CMOS radio frequency switch, the CMOS radio frequency switch comprising one branch or more than one branch coupled in parallel, and each branch comprising at least one NMOS transistor, the device comprising:
a first receiving unit configured to receive a first value indicating a gate voltage value applied by the CMOS radio frequency switch;
a calculating unit configured to obtain a current value of a first function based on the first value, wherein the first function is a function which takes the gate voltage value applied by the CMOS radio frequency switch as an independent variable, when the CMOS radio frequency switch is in an on-state, the value of the first function is a first function value, and when the CMOS radio frequency switch is in an off-state, the value of the first function is a second function value, wherein the first function value is less than the second function value;

a second receiving unit configured to receive a second value indicating a number of the branch in the CMOS radio frequency switch;

a third receiving unit configured to receive a third value indicating a number of the at least one NMOS transistor coupled in series on each branch of the CMOS radio frequency switch;

a first outputting unit configured to output an off-state capacitance value of the CMOS radio frequency switch based on the second value and the third value; and a second outputting unit configured to output an on-state resistance value of the CMOS radio frequency switch based on the second value, the third value and the current value of the first function, wherein the calculating unit takes following function as the first function:

$$F(VG)=2/(PVG1+1+\tanh(VG/PVG2));$$

wherein F(VG) indicates the first function, VG indicates the gate voltage valve applied by the CMOS radio frequency switch, PVG1 indicates a first model parameter value, and PVG1∈(0, 0.01], PVG2 is a second model parameter value, and PVG2 belongs to (0, 1], and tanh(VG/PVG2) is a hyperbolic tangent function of the gate voltage value VG applied by the CMOS radio frequency switch.

6. The device according to claim 5, wherein the first model parameter value PVG1 and the second model parameter value PVG2 are obtained through practical tests.

7. The device according to claim 5, wherein the first outputting unit obtains the off-state capacitance value C(XC1) of the CMOS radio frequency switch by following formula:

$$C(XC1)=CDS1*W/NS;$$

wherein XC1 indicates an equivalent capacitance of the CMOS radio frequency switch in the off-state, CDS1 indicates an off-state capacitance of source-drain of each transistor per unit width, W indicates a product of a width value of each transistor and the second value, and NS indicates the third value.

8. The device according to claim 5, wherein the second outputting unit obtains the on-state resistance value R(XR1) of the CMOS radio frequency switch by following formula:

$$R(XR1)=RDS1*NS/W*F(VG);$$

wherein XR1 indicates an equivalent resistance of the CMOS radio frequency switch in the on-state, RDS1 indicates an on-state resistance of source-drain of each transistor per unit width, W indicates a product of a width value of each transistor and the second value, NS indicates the third value, and F(VG) indicates the first function value taking the gate voltage value VG applied by the CMOS radio frequency switch as the independent variable.

9. A computer-readable storage medium having stored thereon computer instructions, wherein the computer instructions can be executed by a processor to perform steps of the method according to claim 1.

10. A communication terminal comprising a memory having stored thereon computer instructions and a processor, wherein when the computer instructions are executed by the processor, the processor performs steps of the method according to claim 1.

* * * * *